US012058902B2

(12) United States Patent
Liu et al.

(10) Patent No.: US 12,058,902 B2
(45) Date of Patent: Aug. 6, 2024

(54) DISPLAY DEVICE

(71) Applicant: Kunshan Go-Visionox Opto-Electronics Co., Ltd., Jiangsu (CN)

(72) Inventors: Mingxing Liu, Kunshan (CN); Dong Zhao, Kunshan (CN); Yuetao Chen, Kunshan (CN); Shuaiyan Gan, Kunshan (CN); Weili Li, Kunshan (CN); Shizhen Feng, Kunshan (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 453 days.

(21) Appl. No.: 17/504,224

(22) Filed: Oct. 18, 2021

(65) Prior Publication Data
US 2022/0037442 A1 Feb. 3, 2022

Related U.S. Application Data

(63) Continuation of application No. PCT/CN2020/102795, filed on Jul. 17, 2020.

(30) Foreign Application Priority Data

Oct. 21, 2019 (CN) .......................... 201911000579.0

(51) Int. Cl.
*H10K 59/126* (2023.01)
*H10K 59/121* (2023.01)
*H10K 59/65* (2023.01)

(52) U.S. Cl.
CPC ......... *H10K 59/126* (2023.02); *H10K 59/121* (2023.02); *H10K 59/65* (2023.02)

(58) Field of Classification Search
CPC .... H10K 59/126; H10K 59/121; H10K 59/65; H10K 50/841; H10K 50/844;
(Continued)

(56) References Cited

U.S. PATENT DOCUMENTS

2011/0228193 A1    9/2011  Shin et al.
2016/0202516 A1*   7/2016  Watanabe ............. G02F 1/1339
                                                           349/153
(Continued)

FOREIGN PATENT DOCUMENTS

CN     100454103 C    1/2009
CN     101652803 A    2/2010
(Continued)

OTHER PUBLICATIONS

English Machine Translation of Jeon et al., KR 20210040224 (Year: 2024).*

(Continued)

*Primary Examiner* — Donald L Raleigh
(74) *Attorney, Agent, or Firm* — Quarles & Brady LLP

(57) ABSTRACT

A display device, including a display panel and a cover plate covering the display panel. The display panel is provided with a through hole extending through the display panel in a thickness direction thereof. The display panel includes a frame area and an active area. The frame area surrounds the through hole. The active area surrounds the frame area. The cover plate includes a first region, a second region, and a third region. The first region covers the active area. The second region covers the frame area. A surface of the second region adjacent to the display panel is provided with a light-shielding portion thereon. The third region covers the through hole.

18 Claims, 6 Drawing Sheets

(58) Field of Classification Search
CPC .... H10K 50/80; H10K 50/854; H10K 50/856; H10K 50/858; G09F 9/30
See application file for complete search history.

(56) References Cited

U.S. PATENT DOCUMENTS

| | | | |
|---|---|---|---|
| 2017/0068287 A1* | 3/2017 | Jung | G02B 1/111 |
| 2017/0288004 A1* | 10/2017 | Kim | H10K 77/10 |
| 2018/0248150 A1* | 8/2018 | Oh | H10K 59/8792 |
| 2019/0053377 A1 | 2/2019 | Lee et al. | |
| 2019/0129238 A1 | 5/2019 | Wang et al. | |
| 2019/0214600 A1* | 7/2019 | Park | H10K 50/8445 |
| 2019/0243417 A1 | 8/2019 | Ltd | |
| 2020/0174295 A1* | 6/2020 | Baek | G02F 1/1339 |
| 2020/0203660 A1* | 6/2020 | Shi | H10K 77/10 |
| 2021/0072588 A1* | 3/2021 | Tang | G02F 1/133608 |
| 2021/0104583 A1* | 4/2021 | Jeon | H04M 1/0266 |
| 2021/0191006 A1* | 6/2021 | Suzuki | H01L 33/00 |
| 2022/0115480 A1* | 4/2022 | Park | H10K 59/1213 |
| 2022/0140040 A1* | 5/2022 | Zhang | H10K 59/65 257/40 |

FOREIGN PATENT DOCUMENTS

| | | |
|---|---|---|
| CN | 102661574 A | 9/2012 |
| CN | 102884476 A | 1/2013 |
| CN | 107632453 A | 1/2018 |
| CN | 207676585 U | 7/2018 |
| CN | 108681131 A | 10/2018 |
| CN | 108826103 A | 11/2018 |
| CN | 108845450 A | 11/2018 |
| CN | 108919545 A | 11/2018 |
| CN | 108957829 A | 12/2018 |
| CN | 109031756 A | 12/2018 |
| CN | 109040380 A | 12/2018 |
| CN | 109545826 A | 3/2019 |
| CN | 208782856 U | 4/2019 |
| CN | 109887410 A | 6/2019 |
| CN | 110120996 A | 8/2019 |
| CN | 110634410 A | 12/2019 |
| JP | 6070026 B2 | 2/2017 |
| JP | 2019133935 A | 8/2019 |
| JP | 2019139232 A | 8/2019 |
| KR | 1020190073695 A | 6/2019 |
| KR | 20190096467 A | 8/2019 |
| KR | 20210040224 A * | 4/2021 ............. H01L 27/32 |

OTHER PUBLICATIONS

Japanese Decision to Grant(JP Application No. 2021-569094), dated May 23, 2023, 4 pages.
International Search Report and Written Opinion (International Application No. PCT/CN2020/102795) with English Translation, dated Oct. 26, 2020, 15 pages.
Chinese First Office Action 100191 (CN Application No. CN 2019101000579.0) and Search Report with English Translation, dated Sep. 24, 2020, 10 pages.
Chinese Second Office Action 100191 (CN Application No. CN 2019101000579.0) and Search Report with English Translation, dated Jan. 13, 2021, 7 pages.
European search report (EP Application No. 20878636.8), dated Jul. 21, 2022, 8 pages.
Korean Office Action dated Nov. 28, 2023; KR Application No. 10-2021-7037844; KR Patent No. 520150395661; Assignee Kunshan Go-Visionnox Opto-Electronics Co.

* cited by examiner

DISPLAY DEVICE

CROSS-REFERENCE TO RELATED APPLICATIONS

This application is a continuation application of International Application PCT/CN2020/102795, filed on Jul. 17, 2020, which claims the benefit of Chinese Patent Application No. 201911000579.0, filed on Oct. 21, 2019, entitled "DISPLAY DEVICE", the disclosure of both applications is also hereby incorporated by reference in their entirety.

TECHNICAL FIELD

The present application relates to the field of display technology.

BACKGROUND

With the development of display technology, the display screen with the high screen-to-body ratio is getting more and more popular. Generally, a camera of the display device is disposed in the non-active area of the display screen. At present, in order to increase the screen-to-body ratio of the display screen, the following manner is proposed. The active area is notched, the component such as the camera or the telephone receiver is disposed in the notched area in the active area, and the non-active area of the display screen is canceled. However, when the active area is notched, a lateral leakage of light from the organic light-emitting layer tends to occur, thus affecting the photographing effect of the camera and the display performance of the display screen.

SUMMARY

The exemplary embodiments disclosed by the present application provide a display device.

A display device is provided, including a display panel and a cover plate covering the display panel. The display panel is provided with a through hole extending through the display panel in a thickness direction thereof. The display panel includes a frame area and an active area. The frame area surrounds the through hole and is a non-active area. The active area surrounds the frame area. The cover plate includes a first region, a second region, and a third region. The first region covers the active area. The second region covers the frame area. A surface of the second region adjacent to the display panel is provided with a light-shielding portion thereon. The third region covers the through hole.

In the above-described device, the cover plate is divided into the first region, the second region, and the third region. Where, the first region covers the active area, the second region covers the frame area, and the third region covers the through hole. The light-shielding portion is disposed on the surface of the cover plate adjacent to the display panel, that is, the light-shielding portion is arranged around the through hole, so that the light from the active area is reflected or absorbed by the light-shielding portion, thereby changing the travel path of the light. In this case, the light from the active area is prevented from emitting from the through hole, thus improving the photosensitive property of the camera module. Moreover, in this case, the display performance of the display device may also be improved.

DETAILED DESCRIPTION

For a clear understanding of the objectives, features, and advantages of the present application, specific embodiments of the present application will be described in detail with reference to the accompanying drawings. Numerous specific details are set forth in the description below in order to provide a thorough understanding of the present application. However, the present application may be implemented in many other ways other than those described herein, and for those skilled in the art, various improvements and modifications can be made without departing from the scope of the present application, and thus the present application is not limited to the specific embodiments disclosed below.

As described in the background, a high screen-to-body ratio is the development tendency of the display panel. In order to increase the screen-to-body ratio of the display screen, a non-active area of the display screen may be canceled, so that an area of an active area can be increased. When the non-active area is canceled, in order to realize an installment of a front-facing camera module, the active area may be notched to form a through hole for receiving the front-facing camera module, and the front-facing camera module may be disposed in the through hole in the active area, so that the screen-to-body ratio of the display screen can be significantly increased. However, light in the notched active area may leak from the through hole, thereby affecting the photosensitive property of the camera module disposed in the through hole. Moreover, the light leakage will also decrease the display performance of the display panel.

Therefore, in view of the above-described technical problems, the embodiments of the present application provide a display device, in which a light-shielding portion is arranged around the through hole to reflect or absorb light, and/or a light-interfering layer is arranged around the through hole to change a travel path of light, to prevent the light from leaking from the through hole, thus improving both the photosensitive property of the front-facing camera module and the display performance of the display panel.

Figure 1:
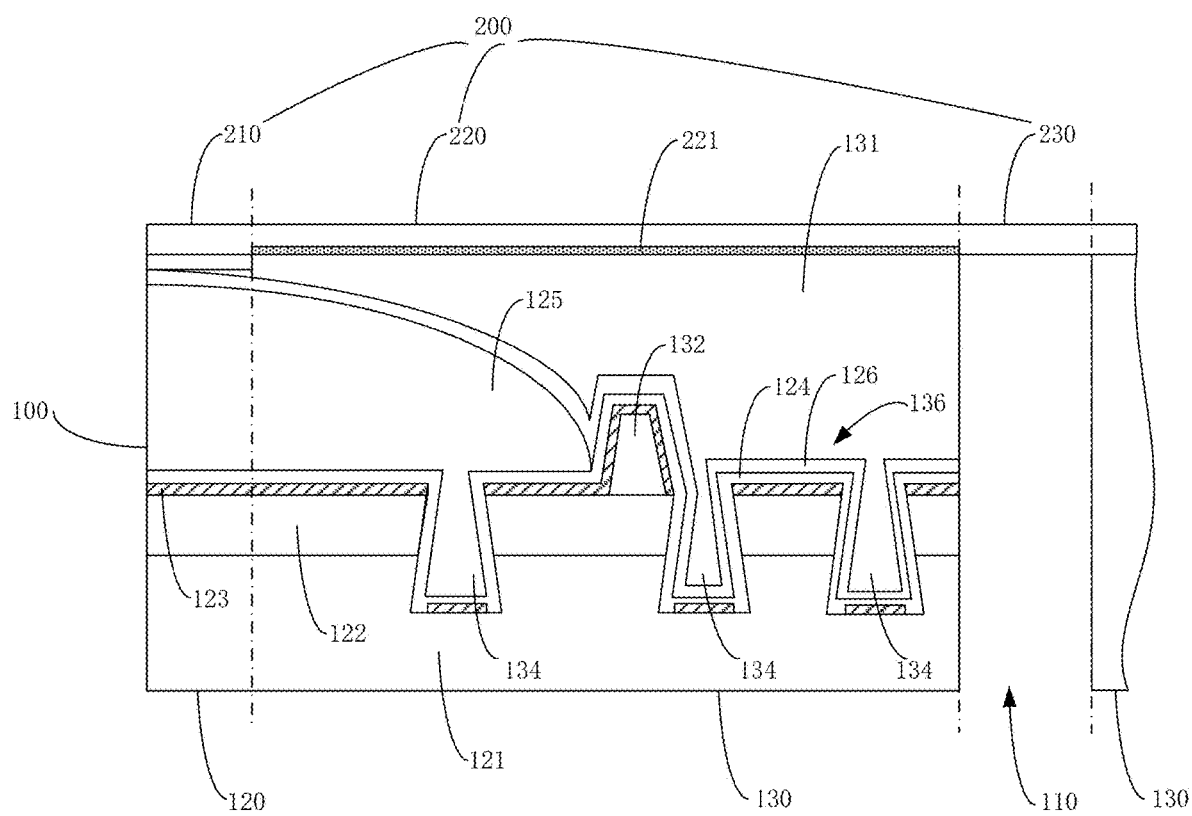
FIG. 1 is a schematic sectional structural view illustrating a display device provided in an embodiment of the present application.

Referring to FIG. 1, a display device provided in an embodiment of the present application includes a display panel 100 and a cover plate 200 covering the display panel 100.

The display panel 100 is provided with a through hole 110 going through the display panel in a thickness direction thereof. The display panel 100 is further provided with an active area 120 and a frame area 130, wherein the frame area 130 is surrounded by the active area 120, and the through hole 110 is surrounded by the frame area 130. The through hole 110 is configured to have a camera module such as a front-facing camera installed therein. The through hole 110 may have a cross-section having a circular shape or any other shape. The frame area 130 is a non-active area around the through hole 110, that is, the frame area 130 has no display function. The active area 120 includes a substrate 121, a pixel circuit layer 122, a light-emitting layer 123, a first inorganic layer 124, an organic layer 125, and a second inorganic layer 126. The first inorganic layer 124, the organic layer 125, and the second inorganic layer 126 constitute an encapsulation structure of the display panel 100. The frame area 130 includes the substrate 121 and an optically clear adhesive layer 131 disposed on the substrate 121. The substrate 121 in the frame area 130 is provided with a plurality of grooves 134 thereon. A protrusion 136 is provided between adjacent grooves 134. The grooves 134 and the protrusion 136 are deposited with the light-emitting layer 123, the first inorganic layer 124, and the second inorganic layer 126 thereon in sequence. The grooves 134 formed in the frame area 130 are configured to cut the light-emitting layer 123 in the frame area 130 to cause the discontinuous extension of the light-emitting layer 123 in the frame area 130, so that the light-emitting layer 123 in the frame area 130 is unable to emit light. Moreover, the grooves 134 may also be configured to disperse stress and thus preventing the fracture and the influence on the display performance The frame area 130 further includes a blocking wall 132 adjacent to an edge of the encapsulation structure. The blocking wall 132 may be configured to isolate the active area from the through hole 110, to prevent the organic layer 125 from flowing into the through hole 110.

The cover plate 200 may be a glass cover plate or a cover plate made of other transparent material. The cover plate 200 includes a first region 210, a second region 220, and a third region 230. The first region 210 covers the active area 120. The second region 220 covers the frame area 130. The third region 230 covers the through hole 110. A light-shielding portion 221 is disposed on a surface of the second region 220, which is adjacent to the display panel 100. Herein, a surface of the cover plate 200 adjacent to the display panel 100 is referred to as a bottom surface, and a surface of the cover plate 200 away from the display panel 100 is referred to as a top surface. Namely, the light-shielding portion 221 is disposed on the bottom surface of the second region 220 of the cover plate 200. When entering the frame area 130, the light from the active area 120 can be reflected by the light-shielding portion 221, so that the travel path of the light is changed, thus preventing the light from emitting from the through hole 110. The light-shielding portion 221 may also adsorb the light from the active area 120. Therefore, the light emitting from the through hole 110 may be significantly reduced, thereby improving the photosensitive property of the camera module disposed in the through hole 110. In this embodiment, the light-shielding portion 221 may cover the entire bottom surface of the second region 220, or may cover part of the bottom surface of the second region 220.

In the display device provided in the above-described embodiment, the light-shielding portion 221 is disposed on the bottom surface of the cover plate 200 in the frame area 130 and configured to change the travel path of the light from the active area 120 and/or adsorb the light from the active area 120, thus avoiding or reducing the light emitting from the through hole 110, thereby improving the photosensitive property of the camera module in the through hole 110 and the display performance of the display panel 100.

In an embodiment, the roughness of the bottom surface of the second region 220 of the cover plate 200 is larger than the roughness of the bottom surface of the first region 210 and larger than the roughness of the third region 230 of the cover plate 200. In this embodiment, the light-shielding portion 221 is the rough bottom surface of the second region 220. A diffuse reflection occurs when the light from the active area 120 reaches the bottom surface of the second region 220 of the cover plate 200, thus reducing the light leaking from the through hole 110, and improving the photosensitive property of the camera module and the display performance of the display device. In this embodiment, the bottom surface of the second region 220 of the cover plate 200 may be pre-processed via a method such as shot blasting to increase the roughness of this bottom surface, so that the roughness of the bottom surface of the second region 220 of the cover plate 200 is larger than the roughness of the bottom surface of the first region 210 and the third region 230 of the cover plate 200.

In an embodiment, the light-shielding portion 221 may be a metal layer. The metal layer may be firstly deposited on the bottom surface of the second region 220 of the cover plate 200 and then attached to the surface of the display panel 100 together with the cover plate 200. The metal layer is used to form a mirror reflection of the light to disturb the travel path of the light, thus preventing the light from the active area 120 from leaking from the through hole 110.

Figure 2:
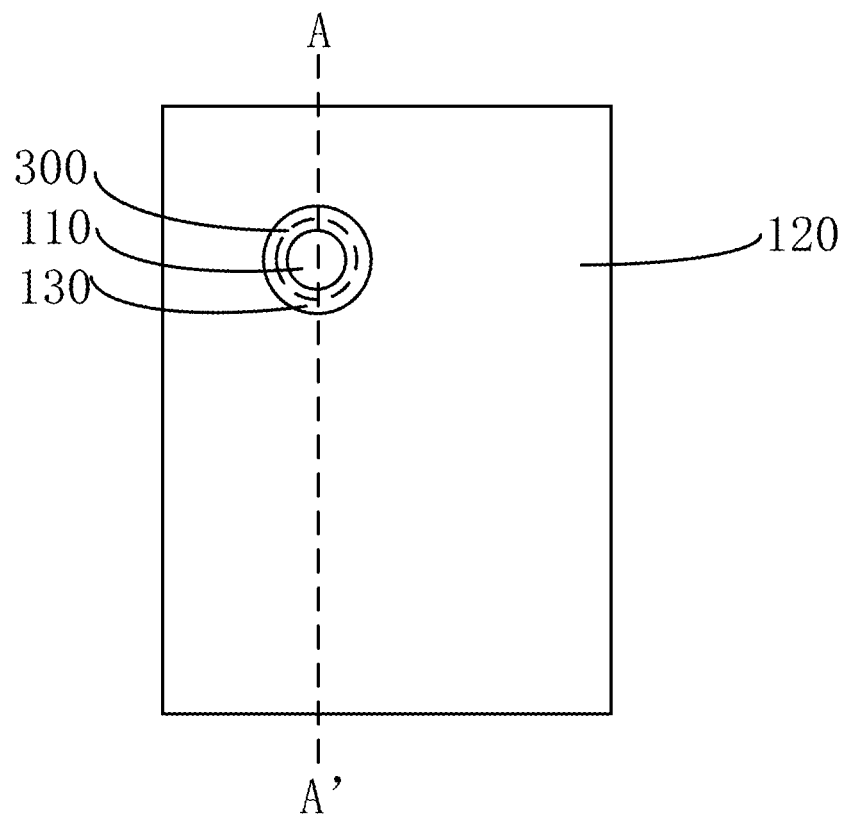
FIG. 2 is a top view illustrating the display device provided in an embodiment of the present application.

In an embodiment, referring to FIG. 2, FIG. 2 is a top view illustrating the display device provided in an embodiment of the present application. The display device further includes a light-interfering layer 300. The light-interfering layer 300 is arranged in the frame area 130 between the active area 120 and the through hole 110 and surrounds the through hole 110. The light-interfering layer 300 is configured to absorb the light from the active area 120 or to change the travel path of the light from the active area 120, to prevent the light from leaking from the through hole 110.

Figure 3:
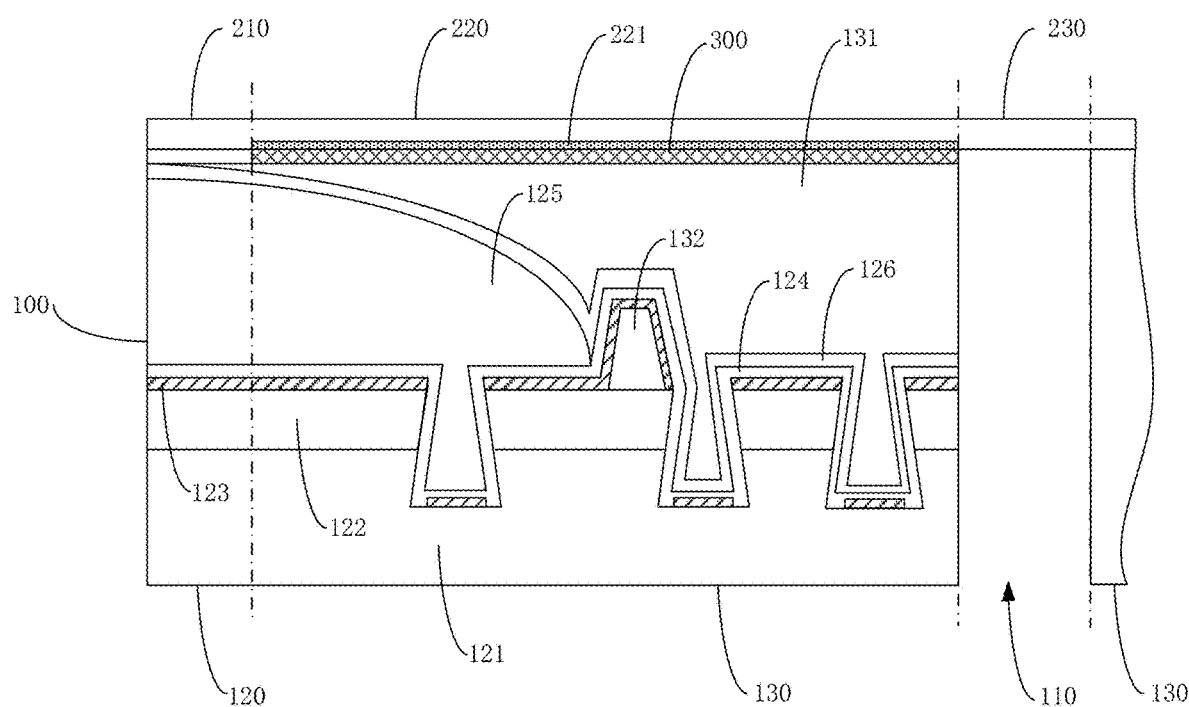
FIG. 3 is a schematic partial sectional view illustrating the display device taken along a dotted line A-A' in the FIG. 2.

More specifically, referring to FIG. 3, FIG. 3 is a schematic partial sectional view illustrating the display device taken along a dotted line A-A' in the FIG. 2. The light-interfering layer 300 is disposed on and in contact with a top surface of the optically clear adhesive layer 131 adjacent to the cover plate 200, and configured to change the travel path of the light from the active area 120 or absorb the light from the active area 120. In an embodiment, the light-interfering layer 300 may cover the entire top surface of the optically clear adhesive layer 131 or part of the top surface of the optically clear adhesive layer 131. In this embodiment, the light-interfering layer 300 may be a black coating. The black coating may overlay the top surface of the optically clear adhesive layer 131 after the optically clear adhesive layer 131 is formed in the frame area 130. Alternatively, the black coating may overlay the bottom surface of the second region 220 of the cover plate 200, and then the cover plate 200 together with the black coating may be attached onto the surface of the display panel 100. The light absorption effect of the black coating is used to absorb the light from the active area 120, thereby reducing the light leaking from the through hole 110, reducing the influence of the lateral leakage of the light from the active area 120 on the photosensitive effect of the camera module disposed in the through hole 110, and improving the display performance of the display panel. Alternatively, the light-interfering layer 300 may be a prism or an organic material having a relatively high surface roughness, as long as it may change the travel path of the light from the active area 120 or may absorb the light from the active area. For example, the prism may be used to refract light to change the travel path of the light, while the organic material having high surface roughness may be used to form a diffuse reflection of light to change the travel path of the light. The organic material having the relatively high surface roughness may be zirconium naphthenate, cobalt naphthenate, nickel naphthenate, titanium naphthenate, or the like.

In the display device provided in the above-described embodiment, the light-interfering layer 300 is arranged in the frame area 130 and disposed on the optically clear adhesive layer 131, and surrounds the through hole 110, thereby changing the travel path of the light from the active area 120 by the light-interfering layer 300 and preventing the light leaking from the through hole 110, eliminating the influence of the lateral leakage of light on, for example, the photographing of the camera, and moreover, improving the display performance of the display device.

Figure 4:
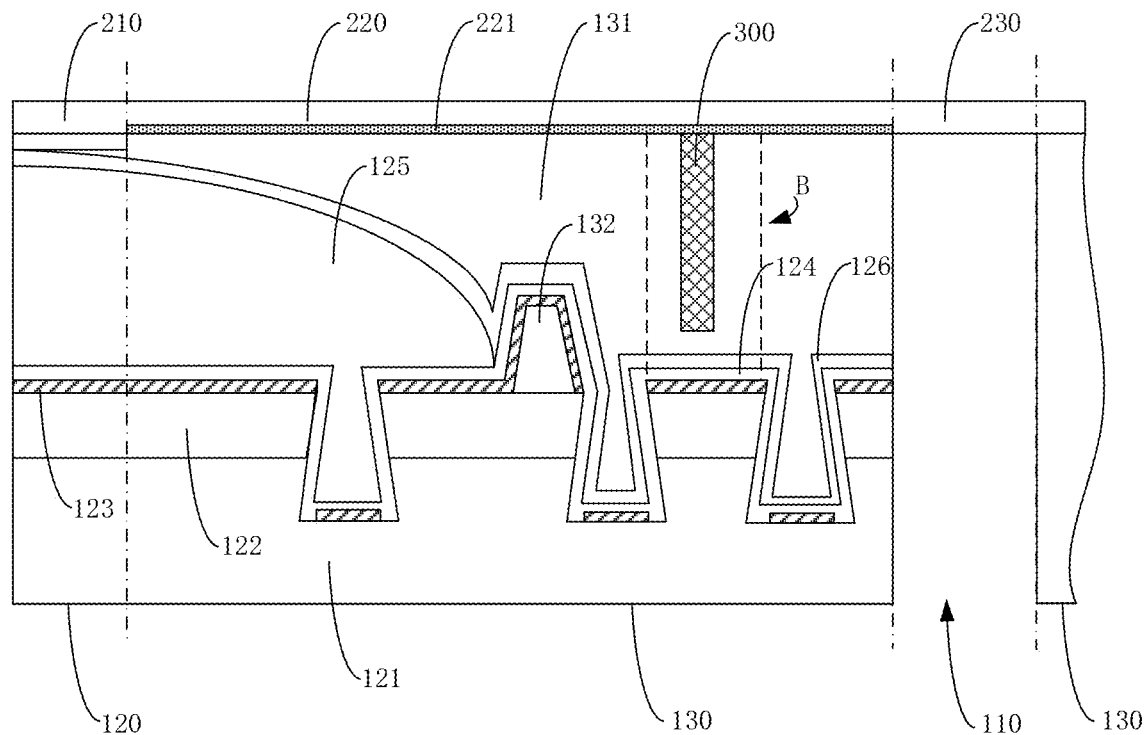
FIG. 4 is a schematic sectional structural view illustrating the display device provided in another embodiment of the present application.

In an embodiment, referring to FIG. 4, a schematic sectional structural view illustrating the display device provided in an embodiment of the present application is shown. In this embodiment, the light-interfering layer 300 may be disposed in the optically clear adhesive layer 131. More specifically, the light-interfering layer 300 is disposed at a side in the optically clear adhesive layer 131 adjacent to the active area 120, and positioned over a location corresponding to the protrusion 136 in the frame area 130. In this embodiment, after the optically clear adhesive layer 131 is formed, a portion of the optically clear adhesive layer 131 adjacent to the active area 120 is etched to form a recess in the optically clear adhesive layer 131. Then the light-interfering layer 300 is formed in the recess. The light-interfering layer 300 can be a black coating. The black coating is arranged proximate to the active area 120 and surrounding the through hole 110, thereby realizing a better light-blocking effect, effectively preventing the light from leaking from the through hole 110, and moreover, improving the photosensitive property of the camera module and the display performance of the display device.

Figure 5:
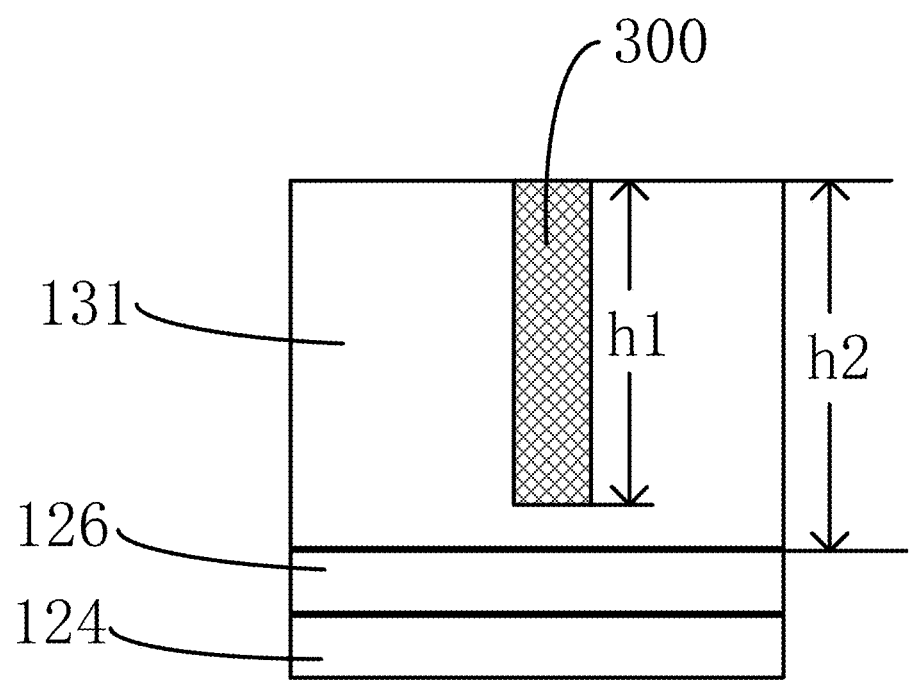
FIG. 5 is a schematic partially enlarged view illustrating a sectional structure at the dotted line frame B in FIG. 4 of the present application.

Referring to FIG. 5, FIG. 5 is a schematic partially enlarged view illustrating a sectional structure at the dotted line frame B in the FIG. 4. As shown in FIG. 5, h1 denotes a height of the light-interfering layer 300 in a direction perpendicular to the display panel 100, and h2 denotes a height of the optically clear adhesive layer 131 disposed at the location corresponding to the light-interfering layer 300, in the direction perpendicular to the display panel 100, and a relationship between the height h1 of the light-interfering layer 300 and the height h2 of the optically clear adhesive layer 131 satisfies:

$$0.5 \times h2 \le h1 \le 0.8 \times h2.$$

If the height h1 of the light-interfering layer 300 is too small, for example, smaller than 0.5×h2, then the shielding and blocking effect is unsatisfying, and relatively much light leaks. If the height of the light-interfering layer 300 is too large, for example, larger than 0.8×h2, then a distance between an end of the light-interfering layer 300 and the second inorganic layer 126 is too small, and thus the second inorganic layer 126 tends to be damaged when the optically clear adhesive layer 131 is etched to form the groove. In addition, if the distance between the light-interfering layer 300 and the second inorganic layer 126 is too small, the stress at this location may be relatively large, thus causing the display panel 100 to be bent and the second inorganic layer 126 to break easily under external stress, and affecting the encapsulation effect. Therefore, a reasonable configuration of the height of the light-interfering layer 300 can improve the light-blocking effect of the light-interfering layer 300 while not affecting the encapsulation effect, thereby improving the photosensitive property of the camera module and the display performance of the display device.

Figure 6:
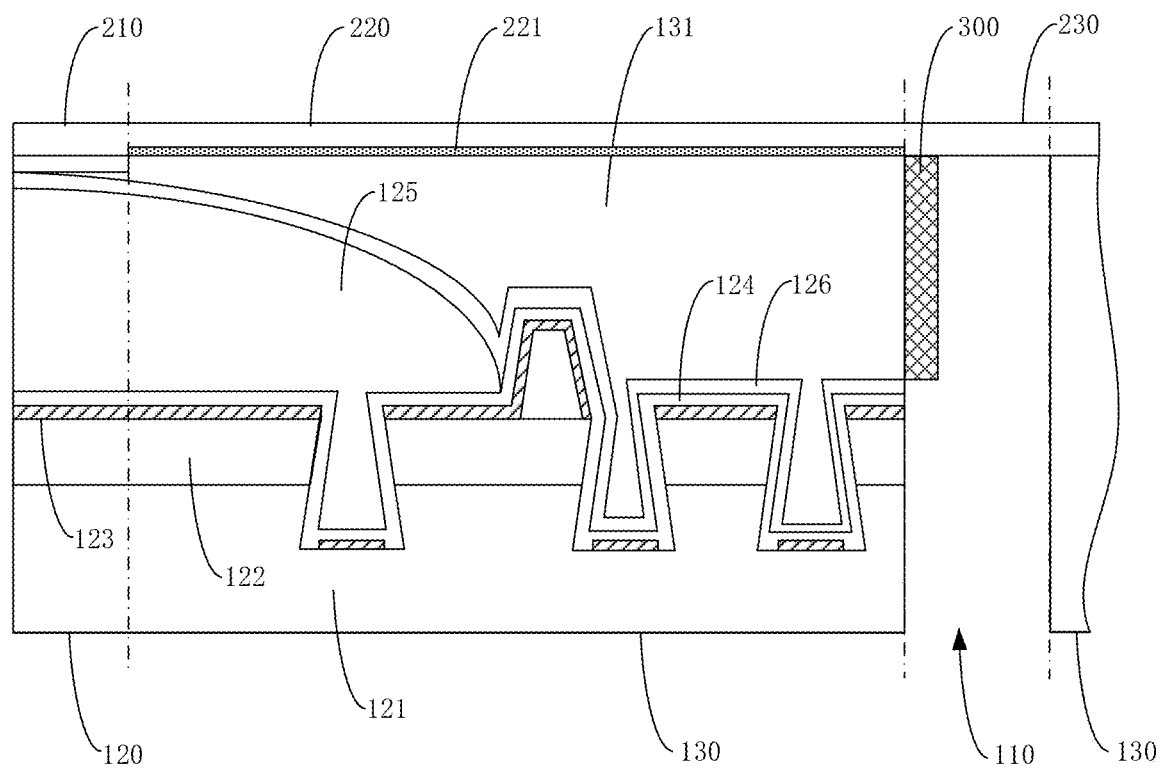
FIG. 6 is a schematic sectional structural view illustrating the display device provided in yet another embodiment of the present application.

Referring to FIG. 6, FIG. 6 is a schematic sectional structural view illustrating the display panel provided in an embodiment of the present application. In this embodiment, the light-interfering layer 300 may be disposed on a surface of the optically clear adhesive layer 131 adjacent to the through hole 110, that is, the light-interfering layer 300 is arranged on and surrounding an inner surface of a sidewall of the through hole 110, or the light-interfering layer 300 is arranged on and surrounding an outer surface of the sidewall of the through hole 110. The height of the light-interfering layer 300 in the direction perpendicular to the display panel 100 and the height of the optically clear adhesive layer 131 in the direction perpendicular to the display panel 100 may be identical or different. When the height of the light-interfering layer 300 in the direction perpendicular to the display panel 100 is the same as the height of the optically clear adhesive layer 131 in the direction perpendicular to the display panel 100, a better light-blocking effect is achieved by the light-interfering layer 300, so that the photosensitive property of the camera module and the display performance of the display panel 100 are significantly improved.

In this embodiment, the light-interfering layer 300 may be any one of the black coating, the prism, and the organic material having a relatively high surface roughness. In an embodiment, the light-interfering layer 300 can be the black coating. In an embodiment where the light-interfering layer 300 is the black coating, the black coating may be formed on an inner sidewall of the through hole 110 while the optically clear adhesive layer 131 is being formed. Alternatively, a layer of the black coating may be formed on the sidewall of the through hole 110 by using a gum-dispensing method after the optically clear adhesive layer 131 is formed.

Alternatively, a light-interfering layer 300 may be formed in a circle in the third region 230 of the cover plate 200 after the cover plate 200 is formed, and a shape of the light-interfering layer 300 is consistent with a shape of the through hole 110, for example, the light-interfering layer 300 is formed in a circle at a periphery of the third region 230, that is, the light-interfering layer 300 is in a shape of a hollow cylinder. The height of the light-interfering layer 300 and the height of the optically clear adhesive layer 131 in the direction perpendicular to the display panel 100 are identical. After the light-interfering layer 300 is formed on and in contact with the cover plate 200, the cover plate 200 together with the light-interfering layer 300 is attached onto the display panel 100, where the light-interfering layer 300 is attached onto the inner sidewall of the through hole 110, and the components such as front-facing camera and the handset are arranged in hollow space.

It should be understood that only the light-interfering layer 300 but no light-shielding portion 221 may be arranged in the display panel 100. In this case, the objective of changing the travel path of light may also be realized.

In the display device provided in the above-described embodiment, the light-interfering layer 300 is arranged in a circle on the inner sidewall of the through hole 100 of the display device, so that the light from the display panel 120 may be blocked, or the travel path of the light is changed, and no light can laterally leak to the through hole and be transmitted outwards, thus improving the photosensitive property of the camera module and the display performance of the display panel 100.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present specification.

What is described above are only several implementations of the present application, and these embodiments are specific and detailed, but not intended to limit the scope of the present application. It should be understood by the skilled in the art that various modifications and improvements can be made without departing from the conception of the present application, and all fall within the protection scope of the present application. Therefore, the patent protection scope of the present application is defined by the appended claims.

What is claimed is:

1. A display device, comprising:
   a display panel, provided with a through hole extending through the display panel in a thickness direction thereof, the display panel comprising:
      a frame area surrounding the through hole; and
      an active area surrounding the frame area; and
   a cover plate covering the display panel, the cover plate comprising:
      a first region covering the active area;
      a second region covering the frame area, a surface of the second region adjacent to the display panel being provided with a light-shielding portion thereon; and
      a third region covering the through hole;
   wherein a substrate in the frame area is provided with a plurality of grooves, and a protrusion is provided between adjacent grooves; and
   a light-emitting layer is disposed on the grooves and on the protrusion, and the light-emitting layer is discontinuous between the grooves and the protrusion.

2. The display device of claim 1, wherein a roughness of a surface of the light-shielding portion adjacent to the display panel is larger than a roughness of a surface of the first region adjacent to the display panel and larger than a roughness of a surface of the third region adjacent to the display panel.

3. The display device of claim 2, wherein the light-shielding portion comprises the surface of the second region adjacent to the display panel.

4. The display device of claim 1, wherein the light-shielding portion covers an entire surface of the second region adjacent to the display panel.

5. The display device of claim 1, wherein the light-shielding portion comprises a metal layer.

6. The display device of claim 1, wherein a light-interfering layer is formed on the cover plate, and the light-interfering layer together with the cover plate, is attached to the display panel.

7. The display device of claim 1, wherein:
   the frame area comprises a substrate and an optically clear adhesive layer disposed on the substrate;
   the display device further comprises a light-interfering layer, and the light-interfering layer is arranged on and surrounding an inner surface of a wall of the through hole.

8. A display device, comprising:
   a display panel, provided with a through hole extending through the display panel in a thickness direction thereof, the display panel comprising:
      a frame area surrounding the through hole; and
      an active area surrounding the frame area; and
   a cover plate covering the display panel, the cover plate comprising:
      a first region covering the active area;
      a second region covering the frame area, a surface of the second region adjacent to the display panel being provided with a light-shielding portion thereon; and
      a third region covering the through hole;
   wherein:
   the frame area comprises a substrate and an optically clear adhesive layer disposed on the substrate; and
   the display device further comprises a light-interfering layer, and the light-interfering layer is disposed in the frame area and is in contact with the optically clear adhesive layer.

9. The display device of claim 8, wherein the light-interfering layer is disposed on a surface of the optically clear adhesive layer adjacent to the cover plate.

10. The display device of claim 9, wherein the light-interfering layer covers an entire surface of the optically clear adhesive layer adjacent to the cover plate.

11. The display device of claim 8, wherein the light-interfering layer comprises any one of an organic material having a high surface roughness, a black coating, and a prism.

12. The display device of claim 8, wherein the light-interfering layer is disposed at a side in the optically clear adhesive layer adjacent to the active area and is in contact with the cover plate.

13. The display device of claim 12, wherein the light-interfering layer comprises a black coating.

14. The display device of claim 12, wherein a relationship between a height of the light-interfering layer and a height of the optically clear adhesive layer in a direction perpendicular to the display panel satisfies:

$$0.5 \times h2 \leq h1 \leq 0.8 \times h2;$$

wherein h1 denotes the height of the light-interfering layer, and h2 denotes the height of the optically clear adhesive layer.

15. The display device of claim 12, wherein the substrate in the frame area is provided with a plurality of grooves thereon, a protrusion is provided between adjacent grooves, and the light-interfering layer is located above the protrusion.

16. A display device, comprising:
   a display panel, provided with a through hole extending through the display panel in a thickness direction thereof, the display panel comprising:
      a frame area surrounding the through hole; and
      an active area surrounding the frame area; and
   a cover plate covering the display panel, the cover plate comprising:
      a first region covering the active area;
      a second region covering the frame area, a surface of the second region adjacent to the display panel being provided with a light-shielding portion thereon; and
      a third region covering the through hole;
   wherein the frame area comprises a substrate and an optically clear adhesive layer disposed on the substrate; and
   the display device further comprises a light-interfering layer, and the light-interfering layer extends circumferentially along a periphery of the third region of the cover plate.

17. The display device of claim 16, wherein a height of the light-interfering layer in a direction perpendicular to the display panel is equal to a height of the optically clear adhesive layer in the direction perpendicular to the display panel.

18. The display device of claim 16, wherein the light-interfering layer is in a shape of a hollow cylinder.

\* \* \* \* \*